(12) United States Patent
Jayaraman et al.

(10) Patent No.: US 7,299,964 B2
(45) Date of Patent: Nov. 27, 2007

(54) METHOD AND APPARATUS TO CREATE ELECTRICAL JUNCTIONS FOR INFORMATION ROUTING IN TEXTILE STRUCTURES

(75) Inventors: Sundaresan Jayaraman, Atlanta, GA (US); Sungmee Park, Atlanta, GA (US)

(73) Assignee: Georgia Tech Research Corp., Atlanta, GA (US)

( * ) Notice: Subject to any disclaimer, the term of this patent is extended or adjusted under 35 U.S.C. 154(b) by 295 days.

(21) Appl. No.: 10/759,691

(22) Filed: Jan. 15, 2004

(65) Prior Publication Data
US 2005/0156015 A1   Jul. 21, 2005

(51) Int. Cl.
  B23K 1/06    (2006.01)
  B23K 31/02   (2006.01)
  D03D 23/00   (2006.01)
  D03D 3/02    (2006.01)
  D03D 15/00   (2006.01)
(52) U.S. Cl. .................. 228/110.1; 228/110; 228/121; 228/248.1; 139/383 R; 139/387 R; 2/264; 2/905; 442/209
(58) Field of Classification Search ............. 228/110.1, 228/121, 248.1; 29/846; 139/273 R, 353, 139/383 R, 387 R; 2/264, 905; 442/209
See application file for complete search history.

(56) References Cited

U.S. PATENT DOCUMENTS

| 1,282,908 A | 10/1918 | Miller |
| 2,049,575 A * | 8/1936 | Sutton .................. 245/10 |
| 2,579,383 A | 12/1951 | Goudsmit |
| 2,935,096 A | 5/1960 | Cole |

(Continued)

FOREIGN PATENT DOCUMENTS

DE    826183    7/1949

(Continued)

OTHER PUBLICATIONS

Textile World—News—Ultrasonics: Sound Technology for Textiles and Nonwovens; www.textileworld.com/News,htm?CD=1728 &ID=4686; pp. 1-7; Dated May 2003.

(Continued)

Primary Examiner—Jonathan Johnson
Assistant Examiner—Rachel E. Beveridge
(74) Attorney, Agent, or Firm—Todd Deveau; Thomas, Kayden, Horstemeyer & Risley LLP (57) ABSTRACT

Disclosed are systems or apparatuses and methods for forming a junction between conductive fibers that are incorporated into a fabric. Briefly, one method includes the steps of removing insulation from two intersecting individually insulated conductive fibers to expose the individually conductive fibers, bringing the exposed individually conductive fibers into contact with each other at a junction point, and forming a molecular bond between the conductive fibers at the junction point. Also disclosed are systems for forming a junction between conductive fibers that are incorporated into a fabric. In this regard, one embodiment of such a system can include a first apparatus that removes insulation from two intersecting individually insulated conductive fibers to expose the individually conductive fibers, a second apparatus that brings the exposed individually conductive fibers into contact with each other at a junction point, and a third apparatus that aids in formation of a molecular bond between the conductive fibers at the junction point.

14 Claims, 7 Drawing Sheets

U.S. PATENT DOCUMENTS

| | | | |
|---|---|---|---|
| 3,020,935 | A | 2/1962 | Balis |
| 3,061,907 | A * | 11/1962 | Nicholl .................. 139/291 R |
| 3,136,650 | A * | 6/1964 | Avila .......................... 427/550 |
| 3,321,558 | A * | 5/1967 | Balamuth et al. ............. 432/13 |
| 3,349,359 | A * | 10/1967 | Morey ........................ 338/208 |
| 3,409,007 | A | 11/1968 | Fuller |
| 3,483,861 | A | 12/1969 | Tiep |
| 3,534,727 | A | 10/1970 | Roman |
| 3,610,250 | A | 10/1971 | Sarbacher |
| 3,970,116 | A | 7/1976 | Takada |
| 4,016,868 | A | 4/1977 | Allison |
| 4,055,166 | A | 10/1977 | Simpson |
| 4,129,125 | A | 12/1978 | Lester |
| 4,174,739 | A | 11/1979 | Rasero |
| 4,299,878 | A | 11/1981 | Rheaume |
| 4,308,872 | A | 1/1982 | Watson |
| 4,572,197 | A | 2/1986 | Moore |
| 4,580,572 | A | 4/1986 | Granek |
| 4,606,968 | A | 8/1986 | Thornton |
| 4,608,987 | A | 9/1986 | Mills |
| 4,668,545 | A * | 5/1987 | Lowe ........................ 428/35.1 |
| 4,708,149 | A | 11/1987 | Axelgaard |
| 4,722,354 | A | 2/1988 | Axelgaard |
| 4,726,076 | A | 2/1988 | Douez |
| 4,727,603 | A | 3/1988 | Howard |
| 4,729,377 | A | 3/1988 | Granek |
| 4,730,625 | A | 3/1988 | Fraser |
| 4,784,162 | A | 11/1988 | Ricks |
| 4,815,473 | A | 3/1989 | Watson |
| 4,846,462 | A | 7/1989 | Regnier |
| 4,889,131 | A | 12/1989 | Salem |
| 4,960,118 | A | 10/1990 | Pennock |
| 5,038,782 | A | 8/1991 | Gevins |
| 5,103,504 | A | 4/1992 | Dordevic |
| 5,125,412 | A | 6/1992 | Thornton |
| 5,212,379 | A | 5/1993 | Nafarrate |
| 5,224,479 | A | 7/1993 | Sekine |
| 5,241,300 | A | 8/1993 | Buschmann |
| 5,263,491 | A | 11/1993 | Thornton |
| 5,316,830 | A | 5/1994 | Adams, Jr. |
| 5,331,968 | A | 7/1994 | Williams |
| 5,348,008 | A | 9/1994 | Bornn |
| 5,353,793 | A | 10/1994 | Bornn |
| 5,374,283 | A | 12/1994 | Flick |
| 5,375,610 | A | 12/1994 | LaCourse |
| 5,415,204 | A | 5/1995 | Kitamura |
| 5,436,444 | A | 7/1995 | Rawson |
| 5,450,845 | A | 9/1995 | Axelgaard |
| 5,454,376 | A | 10/1995 | Stephens |
| 5,592,977 | A | 1/1997 | Kikuchi |
| 5,610,528 | A | 3/1997 | Neely |
| 5,624,736 | A | 4/1997 | De Angelis |
| 5,636,378 | A | 6/1997 | Griffith |
| 5,694,645 | A | 12/1997 | Triplette |
| 5,701,370 | A | 12/1997 | Muhs |
| 5,742,939 | A | 4/1998 | Williams |
| 5,749,365 | A | 5/1998 | Magill |
| 5,759,044 | A | 6/1998 | Redmond |
| 5,766,236 | A | 6/1998 | Detty |
| 5,802,611 | A | 9/1998 | McKenzie |
| 5,817,035 | A | 10/1998 | Sullivan |
| 5,843,554 | A | 12/1998 | Katz |
| 5,864,291 | A | 1/1999 | Walton |
| 5,906,004 | A | 5/1999 | Lebby et al. ....................... 2/1 |
| 5,913,830 | A | 6/1999 | Miles |
| 5,928,157 | A | 7/1999 | O'Dwyer |
| 5,944,669 | A | 8/1999 | Kaib |
| 5,963,891 | A | 10/1999 | Walker |
| 6,014,773 | A | 1/2000 | Banks ............................ 2/69 |
| 6,047,203 | A | 4/2000 | Sackner |
| 6,080,690 | A | 6/2000 | Lebby et al. ............... 442/209 |
| 6,102,856 | A | 8/2000 | Groff |
| 6,106,481 | A | 8/2000 | Cohen |
| 6,145,551 | A | 11/2000 | Jayaraman |
| 6,151,528 | A | 11/2000 | Maida |
| 6,210,771 | B1 | 4/2001 | Post et al. .................. 428/100 |
| 6,324,053 | B1 | 11/2001 | Kamijo ....................... 361/683 |
| 6,381,482 | B1 * | 4/2002 | Jayaraman et al. .......... 600/388 |
| 6,474,367 | B1 * | 11/2002 | Jayaraman et al. ..... 139/383 R |
| 6,493,933 | B1 * | 12/2002 | Post et al. .................... 29/846 |
| 6,687,523 | B1 * | 2/2004 | Jayaramen et al. ......... 600/388 |
| 6,882,897 | B1 * | 4/2005 | Fernandez .................. 700/132 |
| 2004/0244193 | A1 * | 12/2004 | Jung et al. ..................... 29/854 |
| 2004/0259391 | A1 * | 12/2004 | Jung et al. ..................... 439/37 |
| 2005/0025967 | A1 * | 2/2005 | Lawton et al. .............. 428/375 |

FOREIGN PATENT DOCUMENTS

| | | |
|---|---|---|
| DE | 29813614 | 10/1998 |
| FR | 2225560 | 11/1974 |
| FR | 2737651 | 2/1997 |

OTHER PUBLICATIONS

Slide Presentation, High Velocity Penetration Analysis from the DLA/ARPA/NRaD Sensate Liner Workshop held Apr. 11, 1996, Dr. Robert Eisler, MRC, Inc.

Slide Presentation, Introducing Clarity Fit Technologies from the DLA/ARPA/NRaD Sensate Liner Workshop held Apr. 11, 1996; Edity Gazzuolo, Clarity, Inc.

Slide Presentation, Silicone Rubber Fiber Optic Sensors from the DLA/ARPA/NRaD Sensate Liner Workshop held Apr. 11, 1996; Jeffrey D. Muhs.

Slide Presentation, Vital Sign Sensing from the DLA/ARPA/NRaD Sensate Liner Workshop held Apr. 11, 1996; Dr. Herman Watson, NIMS, Inc.

Slide Presentation, Sensate Liner Design & Development; Georgia Tech's Potential Contributions From DLA/ARPA/NRathu D L Sensate Liner Workshop held Apr. 11, 1996; Dr. Sundaresan Jayaraman.

Slide Presentation, Defense Logistics Agency Apparel Research Network Sensate Liner Workshop form DLA/ARPA/NRad held Apr. 11, 1996, Donald O'Brien, Technical Enterprise Team.

Slide Presentation, TPSS/Sensate Liner Technology Development form the DLA/ARPA/NRaD Sensate Liner Workshop held Apr. 11, 1997, Dr. Eric J. Lind.

Slide Presentation, Smart Textiles from the DLA/ARPA/NRaD Sensate Liner Workshop held Apr. 11, 1997, Dr. Michael Burns, SME, Inc.

Slide Presentation, Personal Status Monitor from the DLA/ARPA/NRaD Sensate Liner Workshop held Apr. 11, 1996, Lt. Gen. Peter Kind (Ret), SARCOS.

Slide Presentation, Combat Casually Care Overview from the DLA/ARPA/NRaD held Apr. 11, 1996, Col. R. Satava ARPA.

Slide Presentation, Resources Available Through the Apparel Center at Southern Tech from the Sensate Liner Workshop held Apr. 11, 1996, Dr. Larry Haddock, Southern Tech.

Slide Presentation, Introduction Anthropology Research Project from the DLA/ARPA/NRaD Sensate Liner Workshop held Apr. 11, 1996, Dr. Bruce Bradtmiller.

Slide Presentation, Applications for 3D Human Body Modelling from the DLA/ARPA/NRaD Sensate Liner Workshop held Apr. 11, 1996, Dr. Robert M. Beecher, Beecher Research Company.

Slide Presentation, Prototype Development of Functional Clothing Research from the DLA/ARPA/NRaD Sensate Liner Workshop held Apr. 12, 1996, Donna Albrecht, Univ. of Wisconsin.

Slide Presentation, An Overview of Clemson Apparel Research from the DLA/ARPA/NRaD Sensate Liner Workshop held Apr. 11, 1996, Dr. Chris Jarvis, Clemson Apparel Research.

* cited by examiner

Figure 1. Interactive Textiles: An Innovative, Intelligent Information Infrastructure Figure 2. Electrical Junction in Intersecting Conductive Fibers Figure 3. Information Route Between Connectors through Electrical Junction Figure 4. A Network of Electrical Junctions, Information Routes and Sensors FIG. 5 Principle of Ultrasonic Welding

METHOD AND APPARATUS TO CREATE ELECTRICAL JUNCTIONS FOR INFORMATION ROUTING IN TEXTILE STRUCTURES

STATEMENT REGARDING FEDERALLY SPONSORED RESEARCH OR DEVELOPMENT

The U.S. government has a paid-up license in this invention and the right in limited circumstances to require the patent owner to license others on reasonable terms as provided for by the terms of Contract # F30602-00-2-0564 awarded by the Defense Advanced Research Projects Agency of the U.S. Department of Defense.

TECHNICAL FIELD

The present invention is generally related to a fabric or garment, and a method for creating a network of sensors in such substrate and more particularly to a method and apparatus for creating electrical junctions for information (signal) routing paths within the same.

BACKGROUND

Sensors and sensor networks are pervasive—from homes to battlefields, and everywhere in-between. They are facilitating information processing anytime, anywhere for anyone. Likewise, textiles are pervasive and span the continuum of life from infants to senior citizens; from fashion to functionality; and from daily clothing to geotextiles. Today's individual is extremely active—or dynamic—and is demanding. The explosion of technology—electronics, computing and communications in the form of sensors and sensor networks—has fueled this demanding nature of the individual seeking connectivity and interactivity with surrounding objects and the environment. Also, textiles provide the ultimate flexibility in system design by virtue of the broad range of fibers, yarns, fabrics, and manufacturing techniques that can be deployed to create products for desired end-use applications.

The "technology enablers"—sensors and sensor networks—must be effectively incorporated into traditional textiles to add the third dimension of intelligence to textiles resulting in the next generation of "Interactive Textiles" or "i-Textiles," and pave the way for the paradigm of "fabric is the computer"—the ultimate integration of textiles and information processing or computing.

To-date, no such automated and/or scalable method or technology for information routing has been shown in the art. Thus, a heretofore unaddressed need exists in the industry to address the aforementioned deficiencies and inadequacies.

SUMMARY

Provided are systems and/or apparatuses and methods for creating data paths or information routes by forming junctions between conductive fibers, between a conductive fiber and a sensor, or a connector (for sensor or data output), or both that are incorporated into a fabric.

Briefly described, one embodiment of the method among others, can be summarized by the following steps: bringing individually conductive fibers into contact with each other at a junction point; and forming a bond between the conductive fibers at the junction point. The method may also include the steps of depositing a conductive paste at the junction of the two fibers and/or removing insulation from two intersecting individually insulated conductive fibers to expose the individually conductive fibers.

Also provided herein are systems and apparatuses for forming a junction between conductive fibers that are incorporated into a fabric. In this regard, one embodiment of such a system can include an apparatus that brings the exposed individually conductive fibers into contact with each other at the junction, and a second apparatus that aids in formation of a bond between the conductive fibers at the said junction. In one embodiment, the system is situated in a fabric manufacturing assembly line. In an alternative embodiment, the system further comprises a turntable into which each of the first, second, and third apparatuses is incorporated.

Other systems, methods, features, and advantages of the disclosed systems, apparatuses, and methods will be or become apparent to one with skill in the art upon examination of the following drawings and detailed description. It is intended that all additional systems, apparatuses, methods, features, and advantages be included within this description, be within the scope of the present invention, and be protected by the accompanying claims.

BRIEF DESCRIPTION OF THE DRAWINGS

Many aspects of the disclosed systems and methods for forming junctions between conductive fibers and creating data paths or information routes within the fabric (or garment) can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

DETAILED DESCRIPTION

Figure 1:
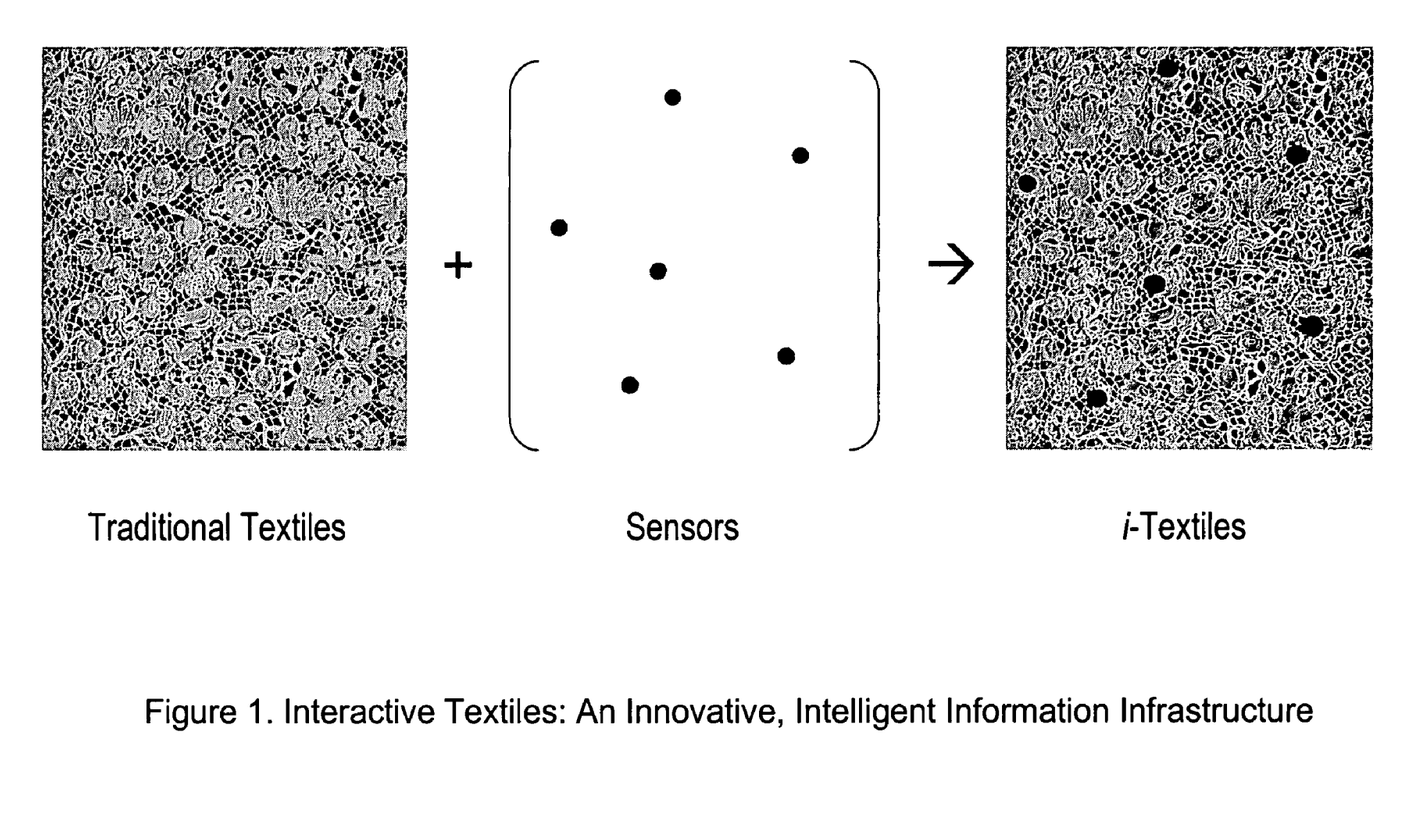
FIG. 1 illustrates an embodiment of a fabric incorporating a network of sensors that can be, optionally, fashioned into a wearable garment.

FIG. 1 is a conceptual representation of this integration between a textile fabric and a network of sensors leading to an intelligent information infrastructure that is customizable, has the typical look and feel of traditional textiles, and has the ability to meet a host of demands ranging from those of dynamic individuals to the deployment of a massive number of sensors and information processing devices over large surface areas in the environment. The term i-Textiles conveys the "dynamic" or "interactive" nature of these new structures that goes beyond the passive incorporation of "electronic" elements into textile structures.

With i-Textiles, information is routed between the various sensors and information processing devices through the fibers/yarns in the fabric. These sensors and devices may be distributed anywhere on the fabric depending on the field of application, but they must interact with each other through the fabric on which they are mounted. Therefore, a "data path" or "information route" must be established in the fabric for the communication channels between the sensors/devices on it and with external devices—either connected physically or via wireless communication. Since the numbers and types of sensors/devices deployed will depend on the end-use application, there is a need for a robust, automatic and cost-effective information routing technology.

The disclosed methods and systems produce an electrical junction in a fabric that has a multi-functional information infrastructure integrated within the fabric. The junction can be formed either "on-line" while the fabric is being formed, or "off-line" after the fabric is formed.

The information infrastructure component can be a conductive fiber made from "intrinsically conductive polymers." Electrically conducting polymers have a conjugated structure, i.e., alternating single and double bonds between the carbon atoms of the main chain. For example, polyacetylene can be prepared in a form with a high electrical conductivity and its conductivity can be further increased by chemical oxidation. Many other polymers with a conjugated carbon main chain have shown the same behavior, e.g., polythiophene and polypyrrole.

Other conducting fibers that can be used as an information infrastructure component are those doped with inorganic or metallic particles. The conductivity of these fibers is quite high if the fibers are sufficiently doped with metal particles, but this makes the fibers less flexible. Examples of thermoplastic conductive material that can be doped and used as the conductive fibers include nylon, polyester, and vinyl.

Metallic fibers, such as copper and stainless steel insulated with polyethylene or polyvinyl chloride, can also be used as the conducting fibers in the fabric. With their exceptional current-carrying capacity, copper and stainless steel are more efficient than any doped polymeric fibers. Also, metallic fibers are strong and they resist stretching, neck-down, creep, nicks, and breaks very well. Therefore, metallic fibers of very small diameter, e.g., of the order of 0.1 mm, are sufficient to carry information from the sensors to the monitoring unit. Even with insulation, the fiber diameter is preferably less that 0.3 mm, and hence these fibers are very flexible and can be easily incorporated into the fabric.

Thus, the preferred electrical conducting materials for the information infrastructure component for the fabric are: (i) doped nylon fibers with conductive inorganic particles and insulated with PVC sheath; (ii) insulated stainless steel fibers; and (iii) thin gauge copper wires with polyethylene sheath. All of these fibers can readily be incorporated into the fabric and can serve to transmit signals through them. An example of an available conducting fiber is X-STATIC® coated nylon with PVC insulation (T66) manufactured by and commercially available from Sauquoit Industries of Scranton, Pa., USA. An example of an available thin copper wire is 24-gauge insulated copper wire from Ack Electronics of Atlanta, Ga., USA.

Examples of high conductivity yarns suitable for use as the electrical conducting component include BEKINOX® and BEKITEX®, manufactured by and commercially available from Bekaert Corporation, Marietta, Ga., USA, which is a subsidiary of Bekintex Nev., Wetteren, Belgium. BEKINOX VN brand yarn is made up of stainless steel fibers and has a resistivity of 60 ohm-meter. The bending rigidity of this yarn is comparable to that of the polyamide high-resistance yarns and can be easily incorporated into the information infrastructure in our present invention. BEKITEX BK50 is a polyester spun yarn with 20% stainless steel fibers, and can be used in the fabric to obtain electrostatic control or electrical conductivity. The conductive fibers can be woven into a fabric in the warp or filling direction or both. Additionally, the fabric/garment with the conductive fiber can be knitted, as opposed to being woven.

Creating Electrical Junctions in the Fabric

The disclosed methods relate to forming physical data paths, e.g., realizing "electrical junctions" in the fabric that include the conductive fibers. A robust and cost-effective junction technology is desirable for creating i-Textiles. The disclosed methods and systems relate to a "scalable" junction technology that facilitates the production of the fabric on a large scale (e.g., quantity-wise) and dimension (e.g., on larger surface areas). This junction technology will be referred to herein as "textillography." Textillography enables the rapid realization of information routing architectures in textile structures. Preferably, the disclosed methods and systems are automated, although the steps can also be performed manually. Automation is preferred for the reproducibility and repeatability of the various steps to create a uniform product on a continuous basis and in large quantities, if desired.

Electrical junctions between conductive fibers incorporated into the fabric can be achieved by the following operations, some of which are optional:

1. Removal of any insulation on the conductive fibers at the zone of the desired junction where selected fibers intersect (also called the "intersection zone");

2. Establishment of the junction between the conductive fibers at their intersection zone;

3. Optional application of a conductive paste;

4. Optional insulation of the junction point to prevent undesirable short circuits; and 5. Optional attachment of a sensor or connector (for sensor or data output).

The details of the various steps are presently discussed. The steps of the following process are carried out in an automated fashion, either on-line during formation of the fabric, or off-line after the fabric has been formed.

1. Removal of Insulation

In order to make a connection of intersecting conductive fibers, it may be desirable to remove any insulation present at the junction of the two fibers. This can be done by any one of a number of ways. Suitable removal techniques include chemical etching, mechanical removal, and any spot welding technique such as ultrasonic welding, laser light application, or other localized heating technique. Preferably, the junction zone is chemically softened for the effective removal of the insulation, such as a vinyl sheath. The process variables for chemical etching are: (i) the amount of insulation present; (ii) the chemical used in the process; (iii) the concentration of the chemical; (iv) the amount of chemical applied; and (v) duration of chemical application. For instance, acetone has been found to work quite well as a chemical-softening agent for insulation such as a vinyl sheath.

In some cases, the conductive fibers may not be insulated. In such cases, it would not be necessary to carry out this step.

Figure 2:
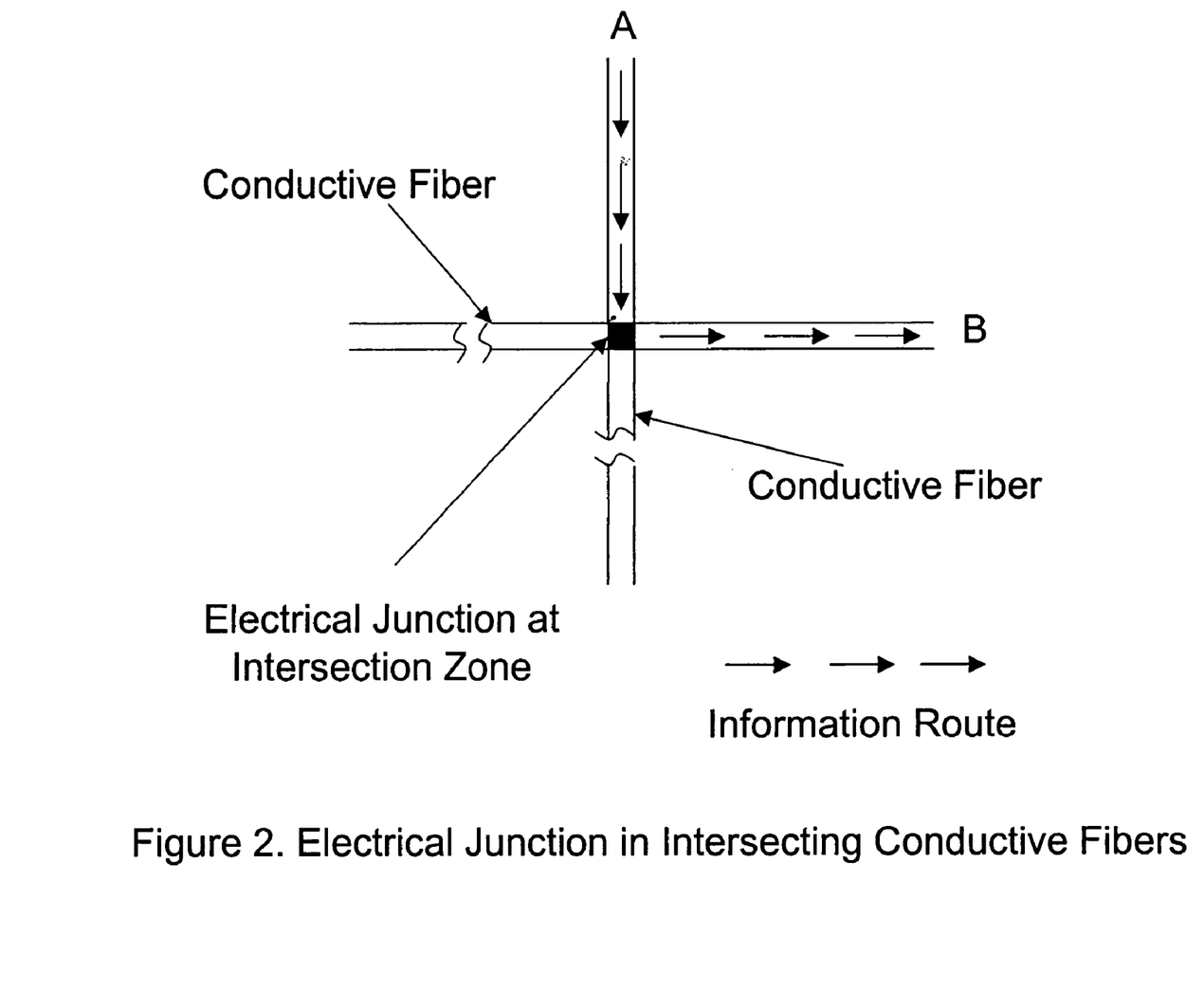
FIG. 2 illustrates the resultant junction of intersecting electrically conductive fibers using the disclosed systems and apparatuses.

2. Establishment of the Junction Between the Electrical Conductive Fibers at an Intersection Zone The next step is to establish a junction between the electrical conductive fibers, as shown in FIG. 2 at the cross-section between two or more fibers. In one embodiment, the intersection zone is "excited" using an ultrasonic welding device that helps establish the desired contact between the fibers in the fabric. A Pinsonic ultrasonic quilting machine, for example, may be used as the ultrasonic welding device. The Pinsonic machine, manufactured by Morrison Berkshire Inc. of North Adams, Mass., US, eliminates the need for additional adhesive products to be incorporated in the product even when joining materials with different melting points.

Figure 5:
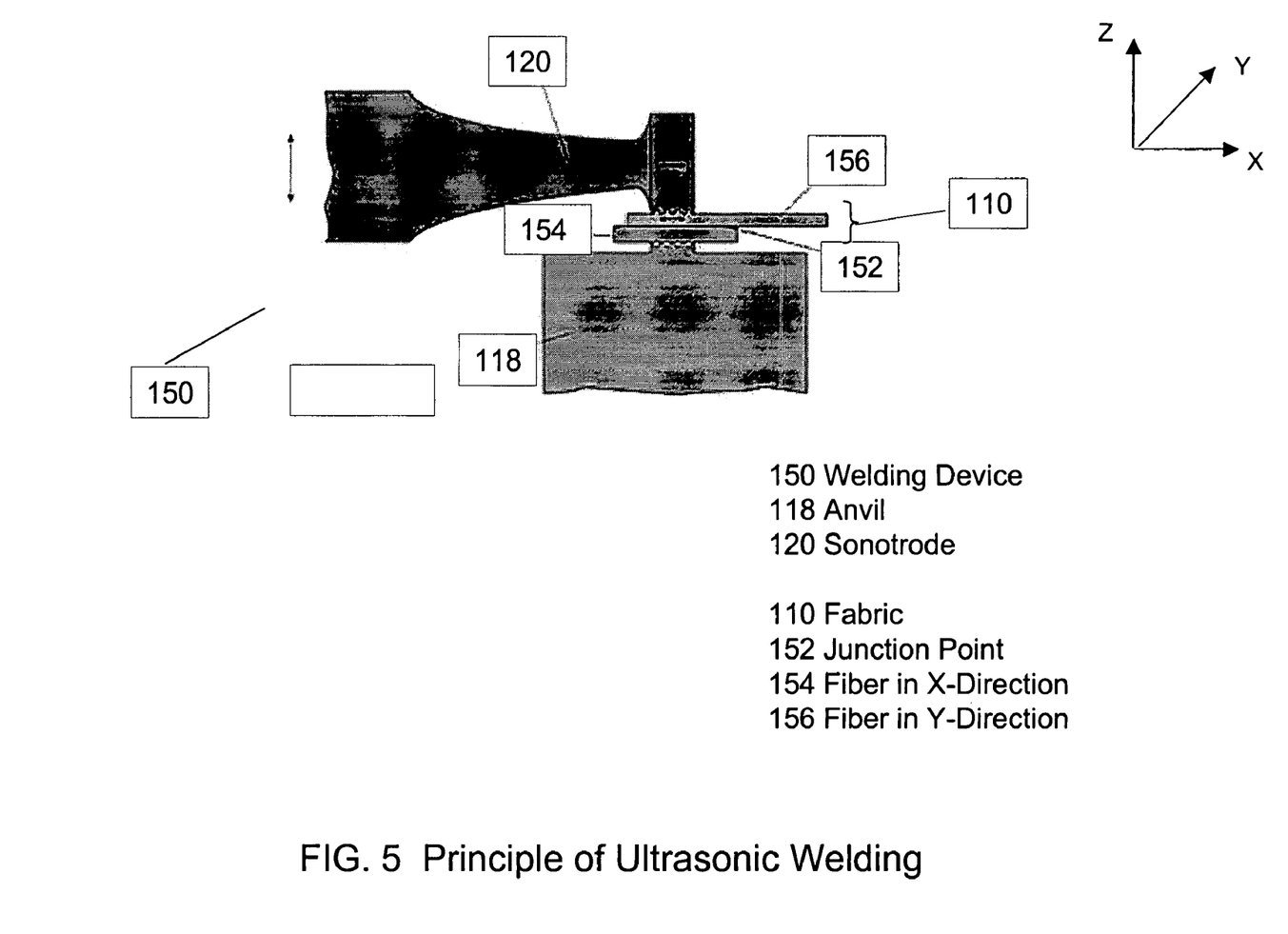
FIG. 5 illustrates an ultrasonic welding device used in one embodiment of the disclosed system to form the junction of FIG. 2.

Another exemplary ultrasonic welding device 150 is illustrated in FIG. 5. The ultrasonic welding device 150 includes an anvil 118 and a sonotrode 120. The anvil 118 is usually made of hardened steel and has a pattern of raised areas machined into it. Disposed between the anvil 118 and the sonotrode 120 is the fabric 110 that includes two intersecting fibers (as shown in greater detail in FIG. 2). In FIG. 5, the fibers are depicted at the junction point 152 as a fiber 154 in the x-direction and a fiber 156 in the y-direction.

Energy needed for the ultrasonic welding is applied in the form of mechanical vibrations imposed on the fibers 154, 156. The sonotrode 120 is connected to the part of a joint turned towards it, which causes it to vibrate in a longitudinal direction. The other part of the joint does not move, as this is secured to a fixed anvil 118. In order for a relative vibration movement to be incurred between the fibers 154, 156 which are to be joined, the connecting surfaces of the sonotrode 120 and the anvil 118 feature a specific configuration.

An ultrasonic generator converts the main current into a high frequency AC current with a certain operating frequency. The power requirement depends on the application and can be from, for example, 500 to 10,000 watts (W). The electrical vibrations are changed in a converter unit (not shown) into mechanical vibrations of the same frequency, transferred via a booster (a transformer unit, also not shown) and the sonotrode 120 onto the fibers 154, 156 that are to be joined. A control unit can control and monitor the welding process and also allow for the electronic assessment of the relevant welding parameters.

In metallurgical terms, ultrasonic metal welding is classified as a "cold welding process." Because of intense friction at the welding points the insulating skin is broken open and the two fibers 154, 156 pressed together at the junction point 152, while at the same time pressure is exerted. These processes trigger the action of atomic-binding forces. The relatively small temperature increase is far below the melting temperature of the fibers, and makes little contribution to the bonding. As there are no structural changes to the fibers, the ultrasonic welding process does not suffer from the adverse effects that such changes can bring.

In other embodiments, the junction between the electrical conductive fibers can be accomplished in a manner other than ultrasonic bonding. For example, chemical bonding, etching, or heating can be used to accomplish the desired junction.

3. Optional Application of a Conductive Paste

The junction 152 between the conductive yarns can be further established by applying a conductive paste in the intersection zone between the conductive yarns/fibers 154, 156. Process variables include: (i) the properties of the conductive paste used in the process; and (ii) the quantity of the paste applied to the intersection zone. The conductive paste should be chosen such that it offers only minimum electrical resistance, adheres well to the conductive fibers 154, 156, and does not chemically react with either the conductive fibers 154, 156 or the other components of the fabric. Based on these requirements, Magnolia Product 3870, a silver-filled epoxy, room temperature curing paste, is a suitable conducting paste. The Magnolia Product 3870 is manufactured by and commercially available from Magnolia Plastics, Inc. of Chamblee, Ga., USA. It also cures well at room temperature and does not react with a polyamide conductive yarn/fabric. Another example of a conductive paste is DuPont's product 4922N, a silver composition thinner.

4. Optional Insulation of the Junction Point

The junction point 152 may be further re-insulated to prevent it from shorting in the presence of moisture. For example, a polyester/urethane based resin can be used to insulate the junction point 152. The insulating layer preferably does not chemically react with the optional conductive paste or other components in the fabric. Further, the insulation should adhere well to the paste and offer adequate insulation.

5. Optional Attachment of a Sensor or Sensor/Data Output Connector

Figure 3:
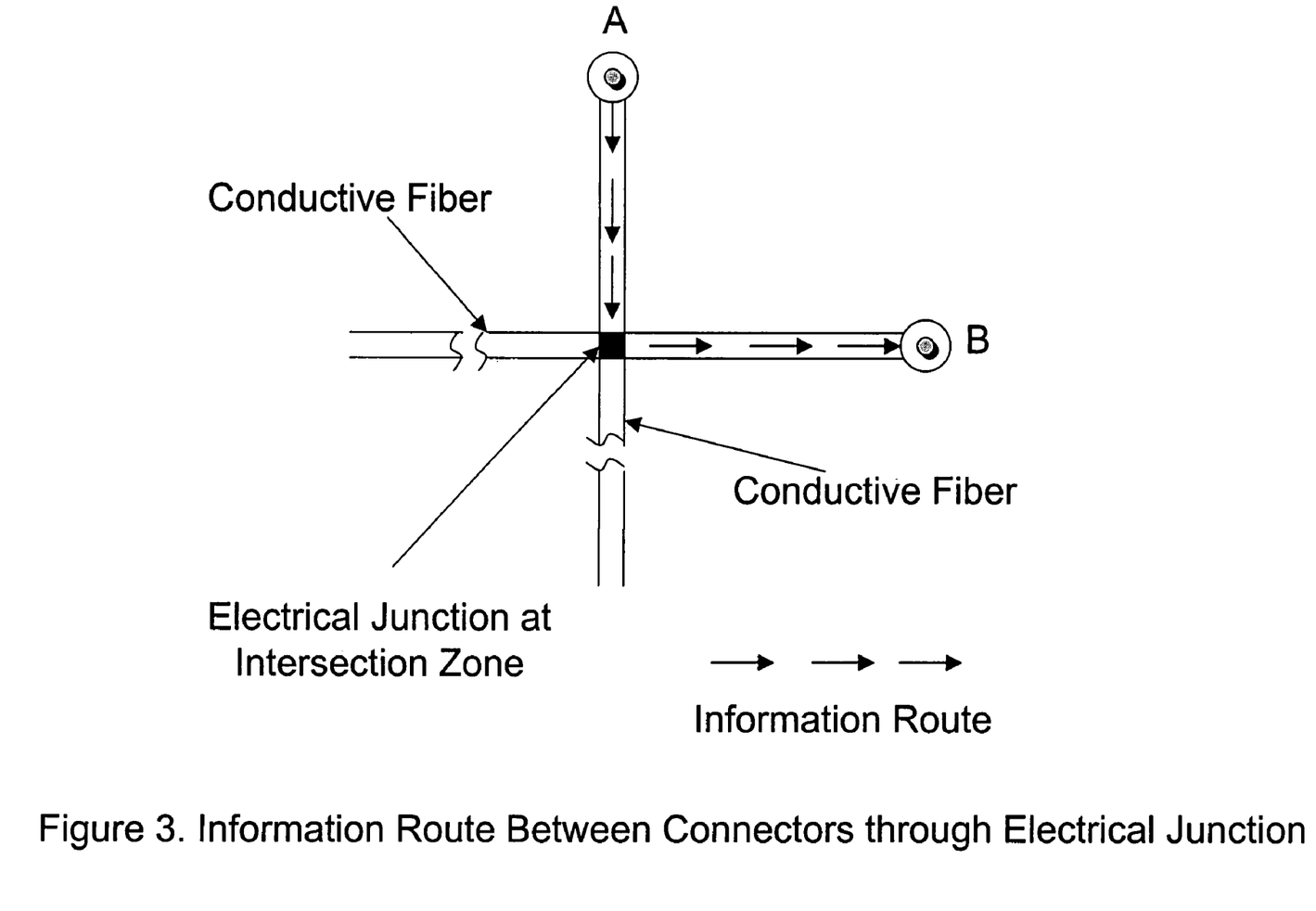
FIG. 3 illustrates an exemplary information route or data path established between the sensor and data output connector at the respective ends of the two fibers through the electrical junction formed in FIG. 2.
Figure 4:
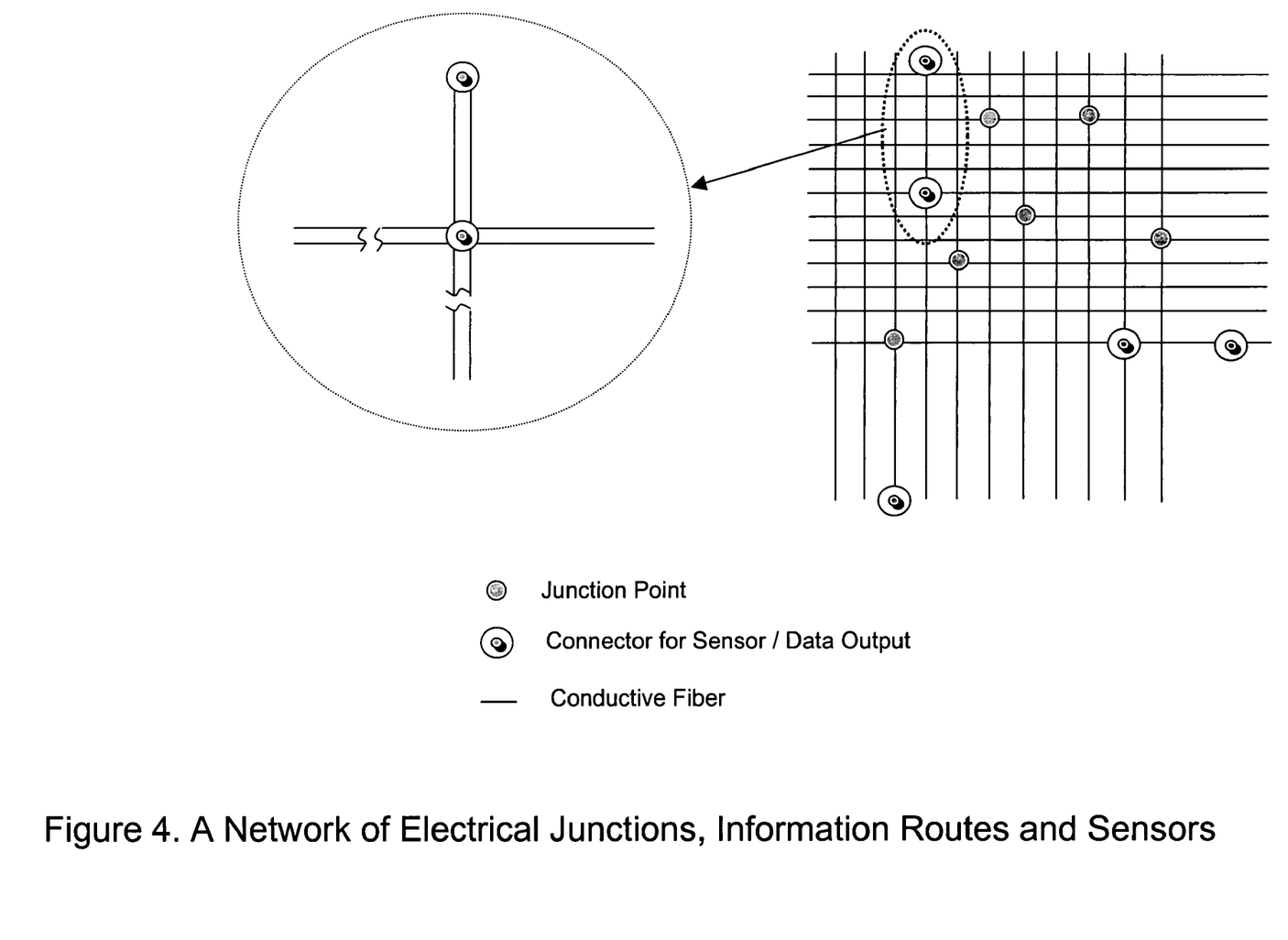
FIG. 4 illustrates an exemplary network of information routes between sensors and data output devices through the electrical junctions in FIG. 2 established over a large surface area.

Additionally, if desired, either a sensor or a sensor/data output connector, such as a T-connector, can be attached at the junction point 152. The T-connector can connect a sensor, such as a GPS sensor, environmental sensor, an EKG sensor or a microphone to the fabric (FIGS. 3 and 4).

Textillography Systems and Methods

There are primarily two modes in which the textillography technology and above process can be applied to the fabric: on-line (e.g., during production of the fabric) or off-line (e.g., after the fabric has already been woven or knitted), each with its own set of advantages. For instance, the fabric's topology is defined and better controlled while it is being produced, which makes on-line textillography advantageous. The overall fabric production process, though, may be slowed, thus affecting fabric production rate if the textillography process is carried out on-line.

1. Off-line Textillography

Figure 6:
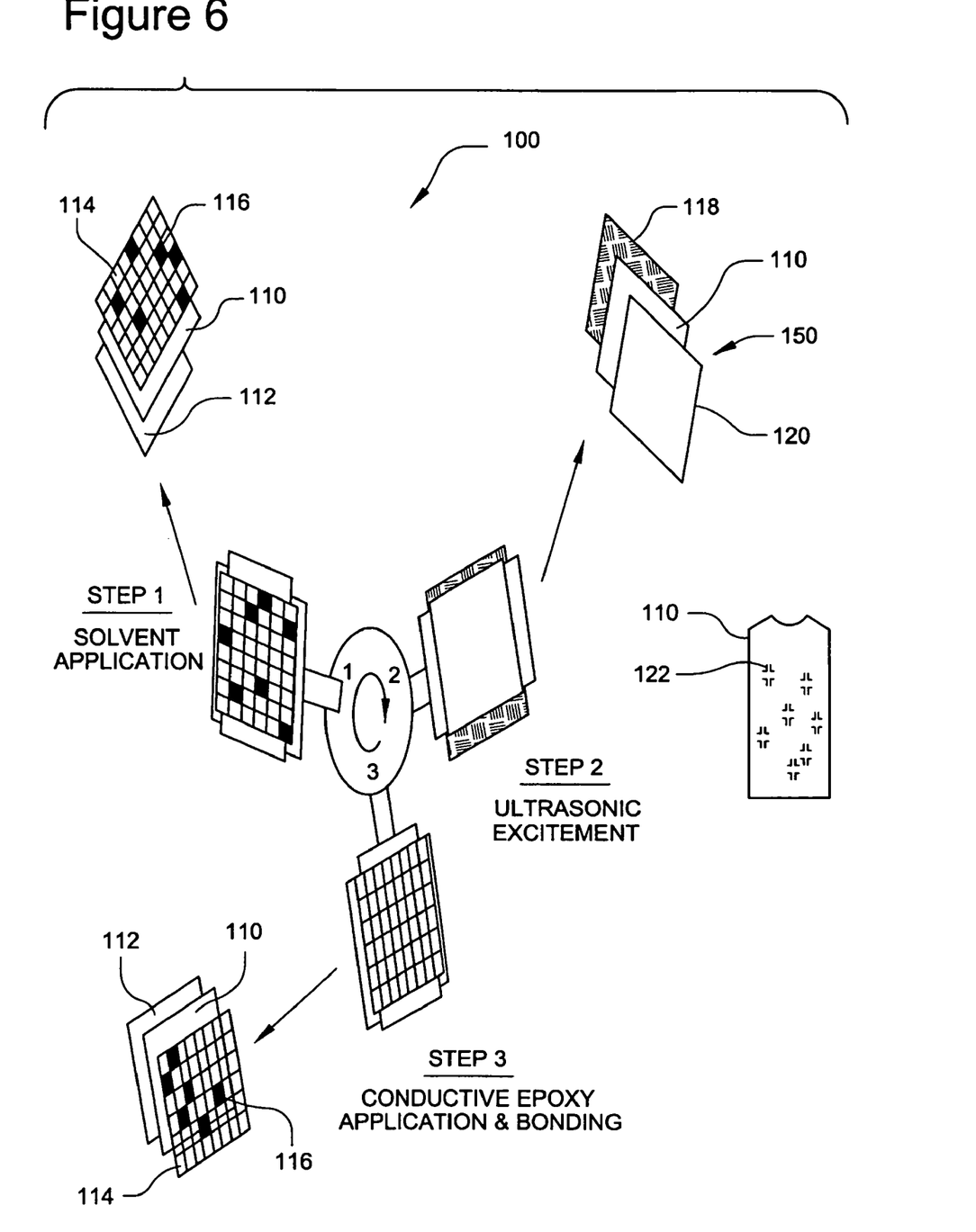
FIG. 6 illustrates a system used to implement one exemplary embodiment for forming the junction of FIG. 2.

FIG. 6 depicts the system 100 that performs the off-line textillography, and also shows the sequence of operations for one embodiment of the above-described method of creating a junction. At optional Step 1, a fabric 110 that includes intersecting electrical conductive fibers is disposed between a placing table 112 and a masking device 114 with dispensers 116. The masking device 114 may be, for example, a mesh. The masking device may be patterned with a via at the intersection of the electrical conductive fibers. As such, the masking device 114 aids in identifying the desired location for the electrically conductive bond between all or select intersecting electrical conductive fibers or conductors.

A solvent is applied at the desired junction point by pressing it through the dispensers 116 of mesh 114. As noted previously, the solvent is used to dissolve any insulation around the fibers specifically at the location of the junction point 152. Thus, if no insulation is present at the desired intersection zone, there is no need to carry out this optional step.

At Step 2, the fabric 110 is moved to a separate station where it undergoes the establishment of an electrical connection between the fibers. As noted above and shown in FIG. 6, preferably the junction is established with the ultrasonic welding device 150. At this station, the fabric 110 is placed between the anvil 118 and the sonotrode 120. After Step 2, the fabric 110 has embossed junction points 122 according to the profile of the anvil 118. Thus, the ultrasonic welding device 114 can also aid in identifying the desired location for the electrically conductive bond between all or select intersecting electrical conductive fibers or conductors. Alternatively, at this station, the junctions also can be established through chemical bonding or laser etching.

At optional Step 3, a conductive epoxy is placed at junction points 152 at a separation station by, for example, pressing it through the dispensers 116 of mesh 114. Additional stations or steps may be provided where the junction points 152 can be re-insulated, and optional sensors or connectors may be applied. The off-line system 100 may be in the form of a "turn-table" type configuration as shown, or in a straight assembly-line process. The system is preferably designed so that multiple pieces of fabric can be processed in sequence, and/or at the same time to facilitate the processing of long and/or wide lengths of fabric.

2. On-line Textillography

Figure 7:
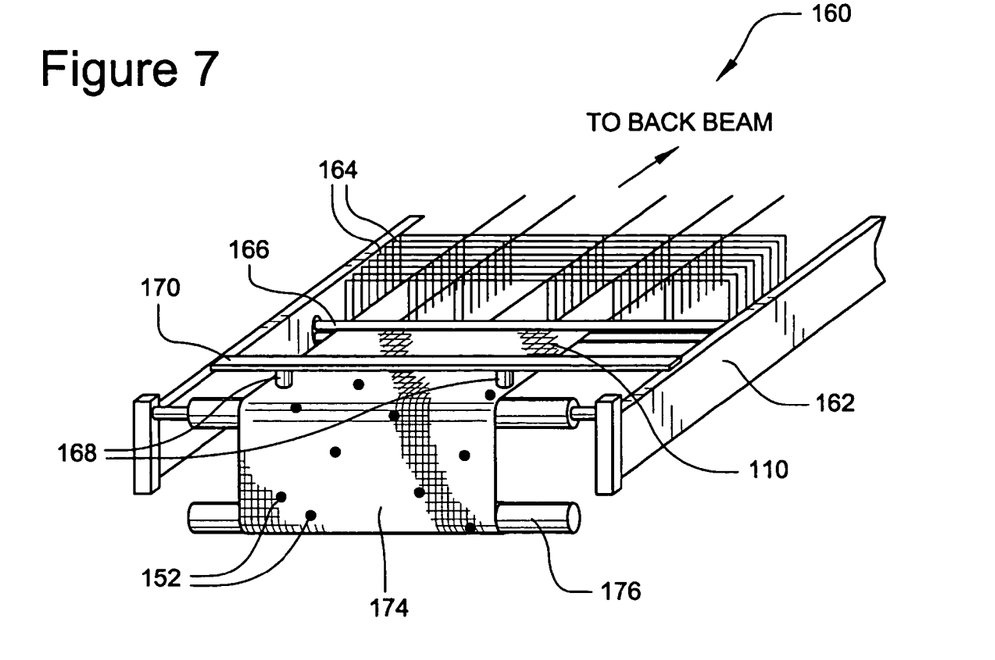
FIG. 7 illustrates an alternative system used to implement another exemplary embodiment for forming the junction of FIG. 2.

FIG. 7 depicts the system 160 that performs the on-line textillography. Using this on-line system 160, the junction points 152 are formed during production of the fabric 110. While the system 160 is depicted in FIG. 7 for production of a woven fabric, similar principles can be incorporated in the production of a knitted fabric.

With the weaving process of FIG. 7, the fibers of the fabric 100, including the electrical conductive fibers, are produced on a loom 162. Harnesses 164 produce a woven fabric 110, after which the fabric 110 passes through a beater roll 166. After passing through the beater roll 166, junction points 152 in the fabric 110 are formed by one or more textillography devices 168 that may be disposed, for example, on a rail 170. The textillography device desirably operates in real-time during the production process at the desired warp/filling intersection, after the fabric 110 has been formed (e.g., after the beater 166, as shown). Preferably, the rail 170 is movable in both the x-, y-, and/or z-directions and can accommodate multiple textillography devices in order to form more than one junction at one time. Additionally, the system 160 may include an array of rails 170 where the textillography devices can form the junction either at one time, or in sequence.

The junction points 152 are therefore woven into the fabric or textile 174, after which the fabric 174 is spooled up on a take-up roll 176. It should be noted that when an array of rails 170 is used to hold textillography devices 168, the distance between the first rail and the take-up roll 176 may be much longer than that depicted in FIG. 7.

Figure 8A:
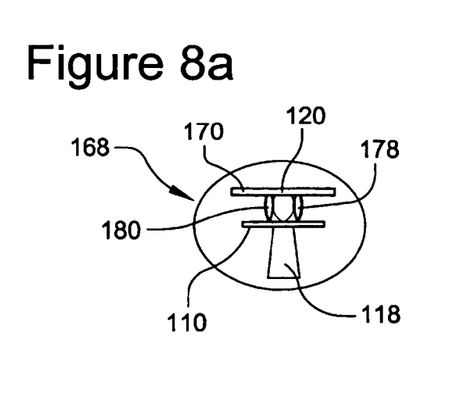
FIG. 8 illustrates an embodiment of a textillography device that may be used in the system of FIG. 7
Figure 8B:
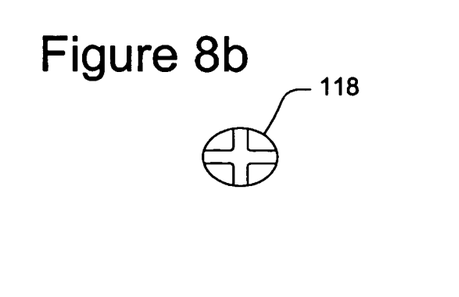

FIG. 8(a) shows an enlarged side view of an exemplary textillography device 168 that may be disposed upon the rail 170. The textillography device 168 includes an optional first dispenser 178 that deposits the solvent at the junction point 152. A sonotrode 120 is disposed laterally in relation to the optional first dispenser 178, with the anvil 118 being disposed beneath the junction point 152 on the fabric 110. An optional second dispenser 180 for dispensing conductive paste is laterally disposed near the sonotrode 120. FIG. 8(b) shows the top view of the fiber or yarn intersection profile on the anvil 118. While an ultrasonic welding device has specifically been depicted in FIGS. 8(a) and 8(b), similar textillography devices 168 can, alternatively, have a dispenser for chemical bonding, or a laser for laser-etching, in order to establish the electrical junction between two fibers in the fabric 110.

Figure 9:
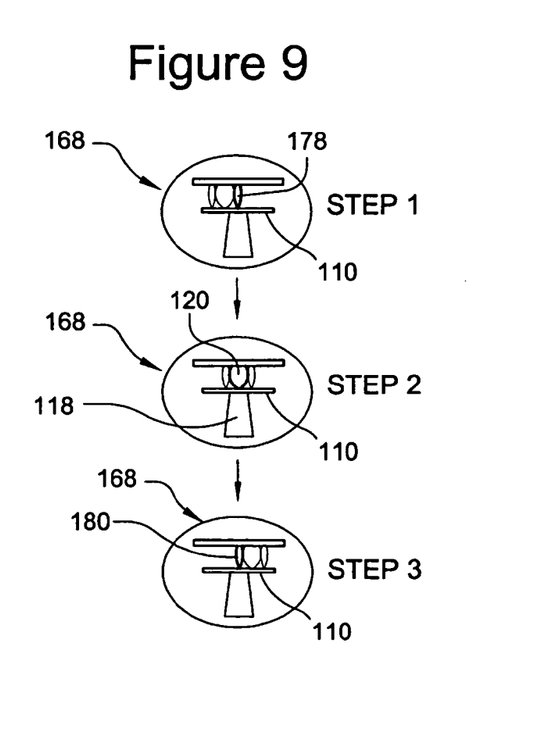
FIG. 9 illustrates one embodiment of a method of using the textillography device of FIG. 8 to form a junction of conductive fibers in a fabric.

FIG. 9 illustrates the textillography device 168 in operation, through three steps. At optional Step 1, a fabric 110 that includes intersecting electrical conductive fibers is disposed between the anvil 118 and the dispenser 178. The dispenser 178 dispenses solvent to dissolve insulation around the fibers specifically at the location of the junction point 152. At Step 2, the fabric 110 is disposed beneath a separate component of the textillography device 168, where it undergoes the establishment of an electrical connection between the fibers. As shown in FIGS. 6-8, the junction may optionally be established by the anvil 118 and the sonotrode 120. At optional Step 3, a conductive epoxy is placed on the junction points 152 via dispenser 180.

It should be emphasized that the above-described embodiments, particularly any "preferred" embodiments, are merely possible examples of implementations, and are merely set forth for a clear understanding of the various principles of the invention. Many variations and modifications may be made to the above-described embodiment(s) without departing substantially from the spirit and principles of the disclosed methods and systems. All such modifications and variations are included in the scope of this disclosure and protected by the following claims.

The invention claimed is:

1. A method of forming a junction or switch between at least two conductors incorporated into a fabric, comprising the steps of:
    providing a fabric with at least two overlapping conductors or sections of a conductor incorporated therein wherein the conductors or sections are individually insulated conductive fibers;
    removing insulation at the junction point from the conductors or sections to expose conductive fiber, wherein the step of removing the insulation includes
    placing the fabric incorporating the conductors or sections between a surface and a masking device, and
    removing insulation at the point of overlap of the conductors or sections identified through the masking device;
    bringing the conductors into contact with each other at a junction point; and
    forming a bond between the conductors at the junction point.

2. The method of claim 1, wherein the step of removing the insulation includes dispensing a solvent through the masking device.

3. The method of claim 1, wherein the conductors include a conductive fiber and a connector.

4. The method of claim 1, wherein the masking device is patterned with a via at the intersection of the two conductors.

5. The method of claim 1, wherein the fabric comprises a computer-generated pattern of intersecting conductive fibers and the masking device comprises a computer-generated pattern with multiple vias that correspond to the pattern of intersecting conductive fibers in the fabric.

6. The method of claim 1, wherein the masking device comprises a material chosen from screen-printing material, plastic, and metal.

7. The method of claim 1, wherein the step of bringing the conductors into contact with each other at a junction point comprises at least one of chemical bonding, laser light application, ultrasonic welding, and combinations thereof.

8. The method of claim 1, wherein the step of bringing the conductors into contact with each other at a junction point comprises:

placing fabric incorporating the conductors between an anvil and a sonotrode;

aligning a desired junction point of the conductors at the contact point of the anvil and sonotrode; and subjecting the conductors to ultrasonic vibrations while pressing the sonotrode and anvil into contact at the junction point.

9. The method of claim 1, further comprising identifying pre-selected points of junction between the two conductors.

10. The method of claim 1, wherein the fabric is already woven or knitted.

11. The method of claim 1, wherein the method is carried out during formation of the fabric.

12. The method of claim 1, wherein forming a bond between the conductors at the junction point comprises:

creating intense friction between the conductors, thereby exciting the conductors;

breaking atomic bonds within each individual conductor; and triggering atomic binding forces between the two conductors.

13. The method of claim 1, further comprising the step of depositing a conductive paste at the junction point of the two conductors.

14. The method of claim 1, wherein the method is performed off-line after fabrication of the fabric.

* * * * *